(12) United States Patent
Sarkar et al.

(10) Patent No.: US 8,097,100 B2
(45) Date of Patent: Jan. 17, 2012

(54) TERNARY ALUMINUM ALLOY FILMS AND TARGETS FOR MANUFACTURING FLAT PANEL DISPLAYS

(75) Inventors: Jaydeep Sarkar, Thiells, NY (US); Chi-Fung Lo, Fort Lee, NJ (US); Paul S. Gilman, Suffern, NY (US)

(73) Assignee: Praxair Technology, Inc., Danbury, CT (US)

( * ) Notice: Subject to any disclaimer, the term of this patent is extended or adjusted under 35 U.S.C. 154(b) by 915 days.

(21) Appl. No.: 11/395,360

(22) Filed: Apr. 3, 2006

(65) Prior Publication Data
US 2009/0022622 A1      Jan. 22, 2009

(51) Int. Cl.
C22C 21/00      (2006.01)

(52) U.S. Cl. ............ 148/437; 204/298.13; 420/528

(58) Field of Classification Search ............ 204/298.13; 420/528, 550–552; 428/432–433, 650–654; 148/437
See application file for complete search history.

(56) References Cited

U.S. PATENT DOCUMENTS

| | | | | |
|---|---|---|---|---|
| 5,509,978 A * | 4/1996 | Masumoto et al. | ............ | 148/403 |
| 5,541,007 A | 7/1996 | Ueda et al. | | |
| 6,033,542 A * | 3/2000 | Yamamoto et al. | ...... | 204/298.13 |
| 6,096,438 A | 8/2000 | Takagi et al. | ............ | 428/472.2 |
| 6,387,536 B1 | 5/2002 | Takagi et al. | ................ | 428/620 |
| 2001/0004856 A1 | 6/2001 | Nishi et al. | ...................... | 75/338 |
| 2004/0126608 A1 * | 7/2004 | Gotoh et al. | .................. | 428/544 |
| 2004/0140197 A1 * | 7/2004 | Watanabe et al. | ........ | 204/192.13 |
| 2005/0112019 A1 * | 5/2005 | Nakai et al. | .................... | 420/550 |
| 2006/0180250 A1 * | 8/2006 | Kugimiya et al. | ............ | 148/437 |

FOREIGN PATENT DOCUMENTS

| | | |
|---|---|---|
| JP | 10199830 | 7/1998 |
| JP | 2000199054 | 7/2000 |
| JP | 2001 223183 | 8/2001 |

OTHER PUBLICATIONS

Onishi et al:, "Effects of Nd Content in Al Thin Films on Hillock Formation", J. Vac. Sci. Technol. A 15(4) (1997) pp. 2339-2348.
Yoshikawa et al., "Spray Formed Aluminum Alloys for Sputtering Targets", Powder Metallurgy 2000, vol. 43 No. 3 (2000) pp. 198-199.
Valiev et al., "Structure and Mechanical Behavior of Ultrafine-Grained Metals and Alloys Subjected to Intense Plastic Deformation", The Physics of Metals and Metallography, vol. 85, No. 3 (1998) pp. 367-377.

(Continued)

*Primary Examiner* — Stanley Silverman
*Assistant Examiner* — Brian Walck
(74) *Attorney, Agent, or Firm* — Nilay S. Dalal; Iurie A. Schwartz

(57) ABSTRACT

A physical vapor deposition target for the manufacturing of flat panel displays is provided. The target includes a ternary alloy system having, by atom percent, a first component in an amount of about 90 to 99.98, wherein the first component is aluminum, a second component in an amount of about 0.01 to 2.0, wherein the second component is a rare earth element selected from the group consisting of Nd, Ce, Dy and Gd, and a third component in an amount of about 0.01 to 8.0, wherein the third element is selected from the group consisting of Ni, Co, Mo, Sc, and Hf.

2 Claims, 2 Drawing Sheets

OTHER PUBLICATIONS

Nakashima et al., "Influence of Channel Angle on the Development of Ultrafine Grains in Equal-Channel Angular Pressing", Acta matter, vol. 46, No. 5 (1998) pp. 1589-1599.

Fan, "Semisolid Metal Processing", International Materials Reviews, vol. 47, No. 2 (2002).

Kang et al., "Thixo Diecasting Process for Fabrication of Thin-Type Component with Wrought Aluminum Alloys and its Formability Limitation", Journal of Materials Processing Technology, 160 (2005) pp. 59-69.

* cited by examiner

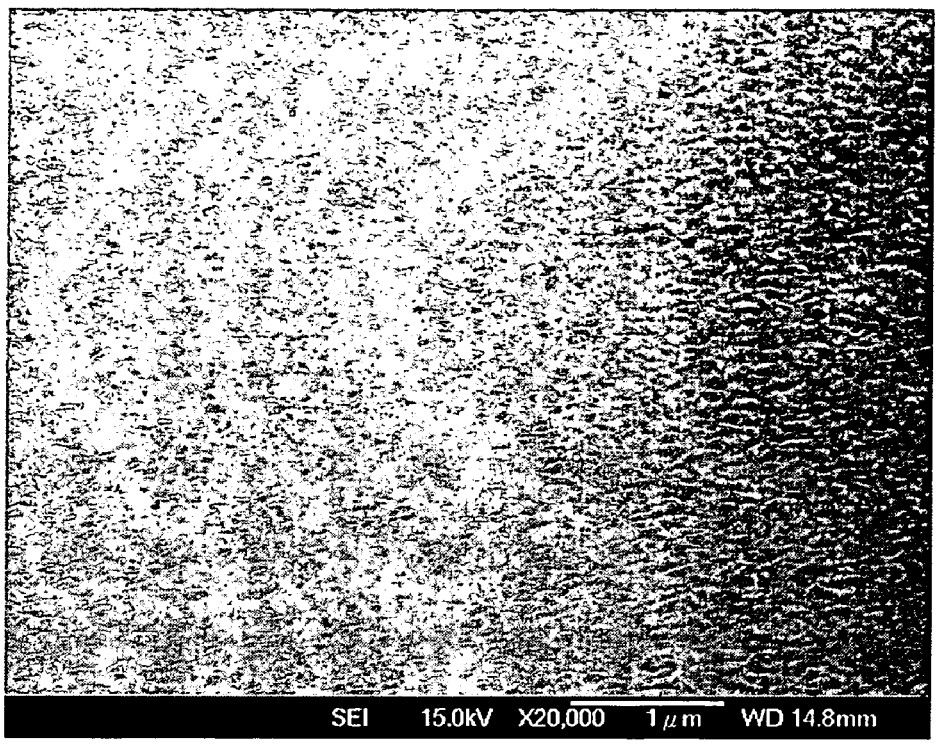
Figure 2 (Al-0.5Nd-1.85Ce alloy film)
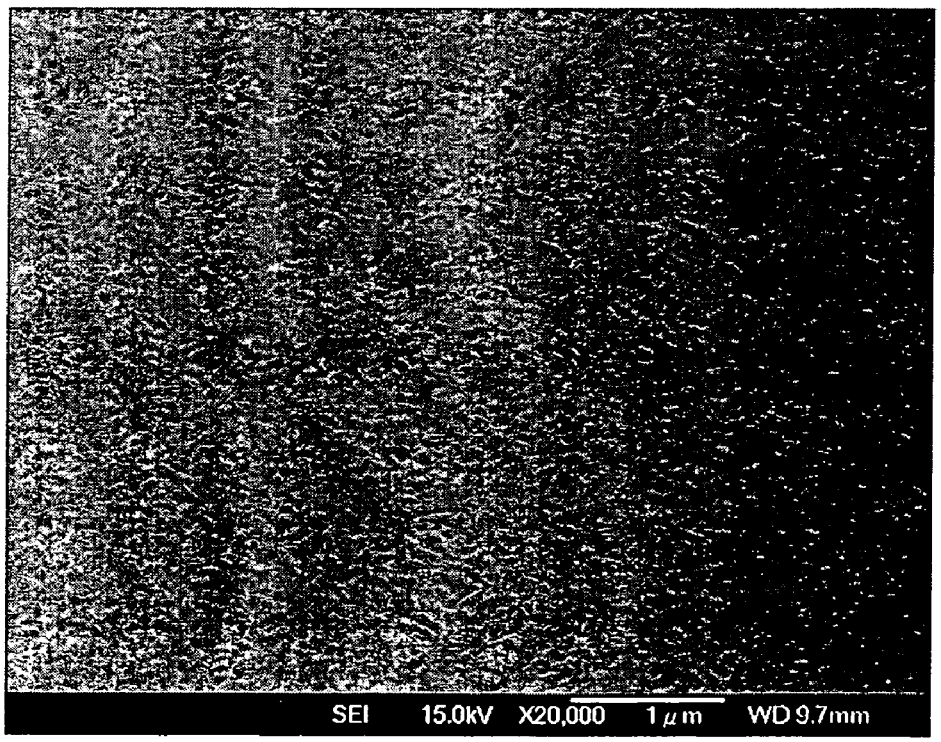
Figure 3 (Al-0.6Nd-2.4Ni alloy film)

TERNARY ALUMINUM ALLOY FILMS AND TARGETS FOR MANUFACTURING FLAT PANEL DISPLAYS

BACKGROUND OF THE INVENTION

1. Field of the Invention

The present invention relates to a ternary alloy thin film for use in the manufacturing of flat panel display and physical vapor deposition target used to produce such films. In particular, the film deposited on the glass substrate exhibits low resistivity and high hillock resistance.

2. Description of Related Art

Flat panel displays such as liquid crystal displays (LCD) are used in many applications such as television sets and notebook-type personal computers. To improve the image quality such as resolution and contrasts thin film transistors (TFTs) have been used as switching elements. TFTs are active devices comprising a semiconductor film formed on an insulating substrate such as a glass substrate and also includes electrodes made of metal films wherein the electrodes are connected to the semiconductor film.

In recent developments of LCDs, there is an increasing tendency toward a larger size panel and a higher resolution. As a result, it has been required to form the electrode film of the LCD of smaller dimensions. Such a reduction in dimension provides an increase in the electrical resistance of interconnections and electrodes. This results in an increase in delay time of the electric signals. To suppress the signal pulse delay caused by the reduction in size of the film electrodes in the LCD to a sufficiently low level to be applicable to color LCDs, and in particular to large-sized color LCDs having a panel size of 10 inches or greater, it is required that the electric resistivity of the electrodes of semiconductor devices be equal to or less than 5 $\mu\Omega$ cm.

As a result, the film used to form the electrode of a semiconductor device in the LCD must have various characteristics, inter alia, low resistivity and high hillock resistance. The resistivity of the material used to form the electrode film in the LCD has an influence on the signal transmitted. In particular, if a material having a high resistivity is used to form the thin electrode, then the high resistivity causes a reduction in the conduction speed of the electric signal and creates an increase in the signal pulse delay. Such a signal pulse delay is an important factor which determines the overall characteristics of the LCD. In large-sized and high-resolution LCDs, the low-resistivity is the most important factor to prevent the delay in the signal.

A reduction in hillock formation is likewise important. The material used to form the electrode film is subjected to temperatures ranging from 300° C. to 400° C. for 20 min to 30 min after the formation of the deposition of the film on the substrate and in the subsequent deposition of insulating film using plasma enhanced chemical vapor deposition (PECVD). When aluminum is employed, as the material to form the electrode in the LCD, small-sized hemispherical protrusions called hillocks are produced on the surface of the film during PECVD deposition of insulating film. The hillocks in the form of hemispherical protrusions are produced due to compressive stress caused by the difference in the thermal expansion coefficient between the glass substrate and the aluminum film. In TFT-LCDS, the electrode film is generally located at the bottom of the multilayer structure. Therefore, the hillocks on the electrode film make it impossible to form other films thereon in a flat shape. Furthermore, when an insulating film is formed on the electrode film, if hillocks are produced on the electrode film, the hillocks can protrude the insulating film and thus cause an electric short circuit (electric insulation failure) between layers.

Thus, in addition to low resistivity, the electrode film material in the LCD is required to have preferably no hillocks and whiskers or less than 0.5 µm hillock size formed during annealing. To address these issues a number of aluminum alloy sputtering targets have been suggested in the related art. For example, Onishi et al *Effects of Nd content in Al thin films on hillock formation*, J. Vac. Sci. Technol. A, Vol. 15(1997) is directed to Al—Nd films where the hillock density is strongly dependent on Nd content.

Yamamoto et al (U.S. Pat. No. 6,033,542) pertains to an electrode for semiconductor devices made of an Al alloy containing one or more alloying elements selected from Al, Co, Ni, Ru, Rh and Ir.

Hiroshi (Japanese Patent Document No. 10-199830) relates to a target material formed of an Al matrix structure containing one element selected among transition elements.

Onishi et al (Japanese Patent Document No. 2000-199054) pertains to an aluminum alloy sputtering target composed of aluminum matrix phases and intermetallic compound phases of aluminum and alloy elements on the grain boundaries between the intermetallic matrix phases.

Yoshikawa et al *Spray formed aluminium alloys for sputtering targets* Powder Metallurgy, Vol. 43 (2000) discloses fine, uniform microstructure sputtering targets of Al—Nd and Al—Ti material manufactured by spray forming.

Takagi et al (U.S. Pat. Nos. 6,096,438 and 6,387,536 B1) pertains to an Al alloy film for use as an electrode of a semiconductor device and an Al alloy sputtering target for depositing same.

Nishi et al (U.S. Patent Application Publication No. 2001/0004856 A1) relates to an aluminum or aluminum alloy sputtering target manufactured by spray forming and in which the maximum length of all the inclusions is 20 µm or less.

The drawbacks associated with the conventional thin film materials and the targets utilized to manufacture same, is that they do not satisfy the requirements needed to manufacture electrode films for the flat panel display.

To overcome the disadvantages of the related art it is an object of the present invention to eliminate a binary Al—Nd alloy and provide an aluminum ternary alloy film and sputter target used to deposit such film. In particular, the films deposited have a resistivity, preferably of less than 5 $\mu\Omega$ cm and high hillock resistance after the film is annealed.

Another object of the invention is to reduce the cost of aluminum ternary systems by reducing or replacing the second component (i.e., Nd) with rare earth metals such as Ce, Dy, Gd, and reduce the rare earth content by adding a less expensive third component.

It is a further object of the present invention to provide a novel manufacturing process for the sputter target, thereby reducing the number of requisite steps necessary to generate homogeneous and fine microstructure of said target.

Other objects and aspects of the present invention will become apparent to one of ordinary skill in the art upon review of the specification, drawings and claims appended hereto.

SUMMARY OF THE INVENTION

According to an aspect of the invention, a physical vapor deposition target for the manufacturing of flat panel displays is provided. The target includes a ternary alloy system having, by atom percent, a first component in an amount of about 90 to 99.98, wherein the first component is aluminum, a second component in an amount of about 0.01 to 2.0, wherein the second component is a rare earth element selected from the group consisting of Nd, Ce, Dy and Gd, and a third component in an amount of about 0.01 to 8.0, wherein the third element is selected from the group consisting of Ni, Co, Mo, Sc, and Hf.

According to another aspect of the invention, a ternary alloy film deposited on a glass substrate, is provided. The film includes a first component in an amount of about 96 to 99.98 by atom percent, wherein the first component is aluminum, a second rare earth component in an amount of about 0.01 to 2.0 atom percent, wherein the second component is Nd, and a third component in an amount of about 0.01 to 2.0 atom percent, wherein the third element is a rare earth element selected from the group consisting of Ce, Dy and Gd.

BRIEF DESCRIPTION OF THE FIGURES

The objects and advantages of the invention will be better understood from the following detailed description of the preferred embodiments thereof in connection with the accompanying figures wherein like numbers denote same features throughout and wherein:

FIG. 2 illustrates SEM photograph of a ternary alloy film deposited with the target of the present invention, wherein the film is a Al-0.5Nd-1.85Ce; and FIG. 3 depicts an SEM photograph of a ternary alloy film deposited with the target of the present invention, wherein the film is an Al-0.6Nd-2.4Ni.

DETAILED DESCRIPTION OF THE INVENTION

Figure 1:
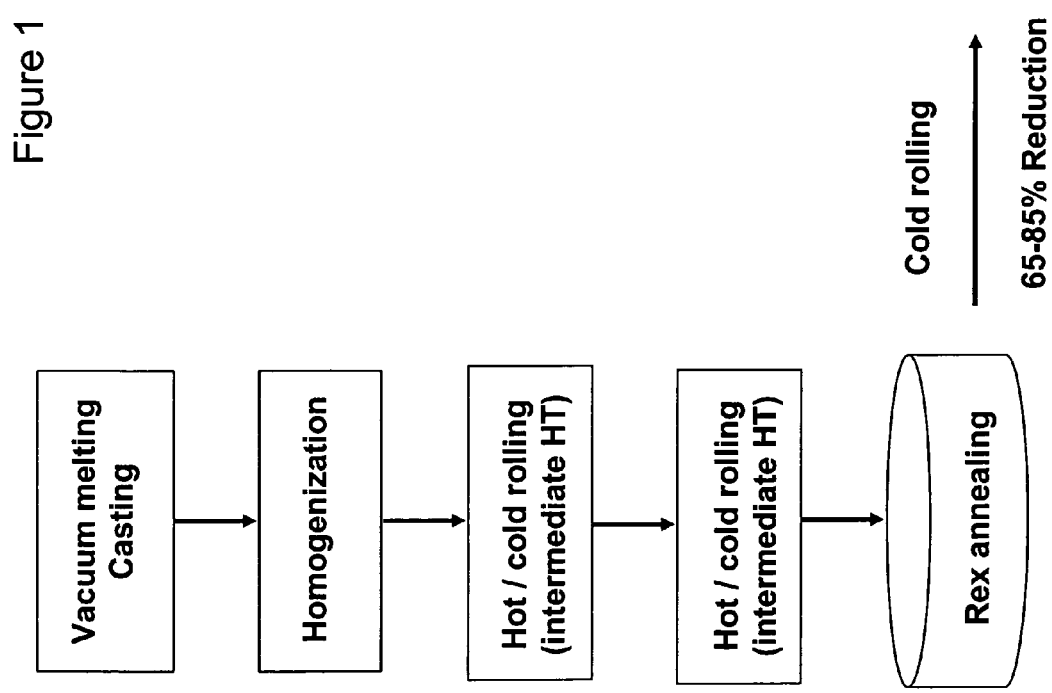
FIG. 1 illustrates a process flow diagram for the manufacturing process of the sputter target and deposition of the film.

The manufacture of flat panel displays, LEDs and LCDs requires a number of processing steps including physical vapor deposition of sputter target to deposit a thin aluminum film onto a substrate. With magnetron sputtering, magnets are located behind the cathode target in a manner that causes closed magnetic field loops to cut through the cathode. A portion of the magnetic field loop is located adjacent the front face of the cathode. The combination of magnetic field and electric field causes electrons to spiral in long confined paths giving rise to a very dense plasma immediately adjacent to the face of the target material. This dense plasma facilitates the increased yield of material sputtered from the target.

The present invention provides the specific alloying for the aluminum alloy composition of the sputter target and the thin film deposited therewith. Specifically, it has been found that the film deposited with the targets of the present invention exhibit low resistivity and substantially no hillock or whisker formation.

A series of experiment determined the composition of the target as being a ternary aluminum alloy. The alloy system has a composition Al—X—Y, wherein the second component X is selected from among the rare earth elements Nd, Ce, Dy and Gd. The second component may be in an amount, by atom percent, ranging from about 0.01 to 2.0, and preferably 0.01 to 1.95. Unless, specifically referred to in other units all weights are understood to be in atom percent. The third component Y is a less expensive component selected from among Ni, Co, Mo, Sc, Hf. The third component may be in an amount, ranging from about 0.01 to 8.0, and preferably 0.01 to 3.50. Generally, the reduction of Nd and replacement therewith with Ce, Dy and Gd, as well as the addition of third component, reduces the rare earth content and, thereby, the cost of the target.

Another alloy system in accordance with the present invention is Al—Nd—Z, where Z is selected from among Ce, Dy, and Gd. The second component Nd is in an amount ranging from 0.01-2.0, and preferably 0.01 to 1.95. The third component Z is in an amount ranging from 0.01 to 2.0, and preferably 0.01 to 1.95.

Alloying the aluminum with the other two components and incidental impurities produces a sputter target, which is evaluated from the electric resistivity and hillock resistance of the film deposited therewith. That is, substantially no hillocks or whiskers are generated when the film is subjected to repeated annealings. For instance, the films may be annealed at 350° C. for 30 minutes or longer. The film preferably would be substantially free of hillocks and would have a low resistivity (preferably, less than 5 $\mu\Omega$ cm).

With reference to FIG. 1, a flow diagram for the manufacturing process of the sputter target and deposition of Al—X—Y or Al—Nd—Z films in accordance with one embodiment of the invention. The melting of the aluminum ternary alloy source material advantageously occurs under a vacuum or protective atmosphere. Preferably, a vacuum melting apparatus can melt the source material in a graphite or ceramic mold. Advantageously, the vacuum is at least $1.0 \times 10^{-5}$ Torr.

Pouring into molds having a low pressure protective atmosphere is a procedure for limiting oxidation. To maintain low impurities, it is important to cast the alloy under a controlled atmosphere such as under protective argon, helium or other Group VIII gas or combination of gases. For example, a low pressure argon atmosphere of about 250 Torr has been found to provide adequate protection to the melt and the ingot upon pouring.

After the molten alloy is cast into a mold, the alloy cools and solidifies. The "as-cast" structure is subjected to a homogenization heat treatment step. After homogenization, the alloy is subjected to thermo-mechanically processes, including but not limited to, anneal heat treatments, hot rolling and/or cold rolling in various sequences based on the physical metallurgy and deformation behavior of the alloy. Anneal heat treatment operations are conducted below 650° C. for variable length of time (several hours) to bring desired changes in the microstructure. Hot and cold rolling operations are carried out to achieve desired shape-change in the blanks and also break the inhomogeneous microstructures to favorable ones. In case of cold rolling smaller reduction per pass is required and material retains more cold work than a hot worked material. The cold rolled target blanks are subsequently subjected to recrystallization anneal treatments at temperatures ranging 250° C. and 500° C. The recrystallization annealing softens the material and also provides it a uniform microstructure.

Alternatively, after homogenization the ingot microstructure may be modified by equal channel angular extrusion (ECAE) to produce fine grain microstructures with a final recrystallization anneal heat treatment. Nakashima et al, "Influence of Channel Angle on the Development of Ultrafine Grains in Equal-Channel Angular Pressing," Acta. Mater., Vol. 46, (1998), pp. 1589-1599 and R. Z. Valiev et al., "Structure and Mechanical Behavior of Ultrafine-Grained Metals and Alloys Subjected to Intense Plastic Deformation," Phys. Metal. Metallog., Vol. 85, (1998), pp. 367-377 provide examples of using ECAE to reduce grain size, and is incorporated herein by reference in its entirety. ECAE introduces an enormous strain into a metal without imparting significant changes in workpiece shape.

Optionally, sputtering target blanks may be fabricated by a two-step process of semisolid processing (i.e., thixocasting followed by reheating to adjust morphological changes in the microstructure). The underlying principles of producing a globular (non-dendritic) microstructure from semisolid processing has been reviewed by Z. Fan ("Semisolid metal processing" International Materials Review, 2002 vol. 47, p. 1-37). Recently, C. G. Kang et al. (C. G. Kang, P. K. Seo, Y. P. Jeon, Journal of Materials Processing Technology, 2005, vol. 160, p. 59-69) has discussed the effect of induction reheating of wrought aluminum alloys above solids to achieve thixo-diecast material with globular (non-dendritic) microstructure. A semi-solid processed alloy can also be subjected to regular thermo-mechanical process steps to produce blanks for sputtering targets.

Afterwards, the target blank is machined to the final dimensions as dictated by the sputter target apparatus.

A sputtering tool that has the capability of depositing films on vertically placed glass substrate (similar to many tools used for flat panel displays) can be utilized. A four inch diameter sputtering target can be employed to lay down an alloy film having a thickness of approximately 500 nm on the glass substrate (3 inch×3 inch). These films are heat treated in a vacuum furnace for 30 min at 350° C. before checked under optical and scanning electron microscopes.

The ternary aluminum alloy films deposited with the targets of the present invention will be further described in detail with reference to the following examples, which are, however, not to be construed as limiting the invention.

Example 1

An Al—Nd—Ce alloy containing 0.5 at % Nd and 1.85 at % Ce (Al-0.5Nd-1.85Ce) was vacuum melted and an ingot was cast in an argon atmosphere. It was ensured that the alloying elements were completely dissolved in the melting process and pouring temperature ranging from about 700 to 730° C. to avoid porosity formation during solidification.

Cast ingot composition was determined by inductively coupled plasma (ICP). The ingots were subjected to a homogenization heat treatment for at least 5 hrs at temperatures between 450° C. and 650° C. and thereafter, water quenched. After thermo-mechanical processing, as described in FIG. 1, cold rolled and recrystallized disks were machined to produce four inch diameter targets. Alloy targets were solder-bonded to copper backing plates before testing.

After a standard burn-in of 1 hr using a power level of 1.0 kW, thin films were deposited on vertically placed glass substrates. Films having a thickness of 500 nm were deposited on 3 inch×3 inch glass substrates for all analytical work. Alloy thin films were annealed for 30 min at 350° C. in a vacuum furnace at a pressure of $2\times10^{-6}$ Torr or less.

Electrical resistivity of each annealed film was measured at room temperature using a four-point probe method. In order to check the presence of defects such as hillocks, whiskers and particles, optical and scanning electron microscopes were employed, as shown in FIG. 2. The recorded resistivity value was 4.35 µΩ cm and no defects were observed. Therefore, these alloy film meets the requirements of less than 5 µΩ cm resistivity and excellent hillock resistance.

Example 2

An Al—Nd—Ni alloy containing 0.6 at % Nd and 2.4 at % Ni (Al-0.6Nd-2.4Ni) was vacuum melted and an ingot was cast in an argon atmosphere. Similar measures, as described with respect to Example 1, were taken during melting and casting practices.

Cast ingot composition was determined by ICP. Ingots were subjected to a homogenization heat treatment for at least 5 hrs at temperatures ranging from 450° C. and 650° C. and thereafter, water quenched. After thermo-mechanical processing, as described in FIG. 1, cold rolled and recrystallized disks were machined to produce a four inch diameter targets. The alloy targets were solder-bonded to copper backing plates.

After a standard burn-in of 1 hr using a power level of 1.0 kW, thin films were deposited on vertically placed glass substrates. Films having a thickness of 500 nm were deposited on 3 inch×3 inch glass substrates for all analytical work. The alloy thin films were annealed for 30 min at 350° C. in a vacuum furnace at a pressure of $2\times10^{-6}$ Torr or less.

Electrical resistivity of each annealed film was measured at room temperature using a four-point probe method. In order to check the presence of defects such as hillocks, whiskers and particles, optical and scanning electron microscopes were used, as shown in FIG. 3. The recorded resistivity value was 4.3 µΩ cm and no defects were observed. Therefore, these alloy films meet the requirements of less than 5 µΩ cm resistivity and excellent hillock resistance. Thus, aluminum alloys of present inventions can be advantageously used in flat panel display applications.

While the invention has been described in detail with reference to specific embodiments thereof, it will become apparent to one skilled in the art that various changes and modifications can be made, and equivalents employed, without departing from the scope of the appended claims.

What is claimed is:

1. A physical vapor deposition target for the manufacturing of flat panel displays, comprising:
a ternary alloy system selected from the group consisting of Al—Ce—Hf, Al—Dy—Co, Al—Gd—Co and Al—Gd—Hf, wherein by atom percent, the first component in an amount of about 90 to 99.98, the second component in an amount of about 0.01 to 2.0, and the third component in an amount of about 0.01 to 8.0, wherein the ternary alloy is vacuum melted and cast into an ingot, which is subsequently hot worked at temperatures ranging from about 450-625° C., cold rolled and then subjected to recrystallization anneal treatments at temperatures ranging from 250-500° C., wherein the target produces a film having an electrical resistivity of less than about 5 µΩcm.

2. The physical vapor deposition target of claim 1, wherein the second component is in an amount of about 0.01 to 1.95 by atom percent and the third component is in an amount of about 0.01 to 3.5 by atom percent.

* * * * *